United States Patent
Peterson et al.

(10) Patent No.: US 12,075,586 B2
(45) Date of Patent: Aug. 27, 2024

(54) SELF-ALIGNING MECHANICAL MOUNT AND ELECTRICAL CONNECTION SYSTEM FOR ELECTRONIC MODULES WITH FEATURES FOR ROBOTIC ASSEMBLY

(71) Applicant: APTIV TECHNOLOGIES LIMITED, St. Michael (BB)

(72) Inventors: David R. Peterson, Aurora, OH (US); Jared Bilas, North Bloomfield, OH (US); Kurt P. Seifert, Cortland, OH (US); Jeffrey S. Campbell, West Bloomfield, MI (US); Wesley W. Weber, Jr., Metamora, MI (US); Christian Schaefer, Bochum (DE)

(73) Assignee: APTIV TECHNOLOGIES AG, Schaffhausen (CH)

( * ) Notice: Subject to any disclaimer, the term of this patent is extended or adjusted under 35 U.S.C. 154(b) by 0 days.

(21) Appl. No.: 18/073,791

(22) Filed: Dec. 2, 2022

(65) Prior Publication Data
US 2023/0087909 A1    Mar. 23, 2023

Related U.S. Application Data

(63) Continuation of application No. 17/128,328, filed on Dec. 21, 2020, now Pat. No. 11,523,530.
(Continued)

(51) Int. Cl.
*H01R 13/62* (2006.01)
*B60R 16/02* (2006.01)
(Continued)

(52) U.S. Cl.
CPC ........... *H05K 7/12* (2013.01); *B60R 16/0207* (2013.01); *B60R 16/0239* (2013.01);
(Continued)

(58) Field of Classification Search
CPC ........ H05K 7/12; H05K 7/04; B60R 16/0207; B60R 16/0239; H01R 12/771;
(Continued)

(56) References Cited

U.S. PATENT DOCUMENTS

| | | | | |
|---|---|---|---|---|
| 4,934,943 A | * | 6/1990 | Klein | ................... H01R 12/737 439/248 |
| 5,615,080 A | * | 3/1997 | Nishitani | ............ B60R 16/0239 361/647 |

(Continued)

FOREIGN PATENT DOCUMENTS

| | | |
|---|---|---|
| DE | 102005036300 A1 | 2/2007 |
| EP | 0872918 B1 | 5/2002 |

OTHER PUBLICATIONS

European Search Report dated May 19, 2021. 7 pages.

*Primary Examiner* — Abdullah A Riyami
*Assistant Examiner* — Vladimir Imas
(74) *Attorney, Agent, or Firm* — Miller Johnson

(57) ABSTRACT

A self-aligning mechanical mount and electrical connection system for an electronic module comprises a mechanical mount assembly configured to be integrated into or attached to a base frame and defining a mount connection position assurance (CPA) feature for self-aligning and securing of the electronic module therein, and an electrical connection assembly configured to be integrated into or attached to the mechanical mount assembly and comprising a modular electrical connector (i) being electrically connected to an electrical backbone wire cable and (ii) defining a connector CPA feature for self-aligning the modular electrical connector with a corresponding electrical connector integrated into or attached to the electronic module when the electronic module is secured in the mechanical mount assembly.

21 Claims, 6 Drawing Sheets

Related U.S. Application Data

(60) Provisional application No. 62/956,884, filed on Jan. 3, 2020.

(51) Int. Cl.
*B60R 16/023* (2006.01)
*H01R 12/77* (2011.01)
*H01R 13/518* (2006.01)
*H01R 13/631* (2006.01)
*H02G 1/06* (2006.01)
*H02G 3/32* (2006.01)
*H05K 7/12* (2006.01)
*H01R 12/70* (2011.01)
*H05K 7/04* (2006.01)

(52) U.S. Cl.
CPC ......... *H01R 12/771* (2013.01); *H01R 13/518* (2013.01); *H01R 13/631* (2013.01); *H02G 1/06* (2013.01); *H02G 3/32* (2013.01); *H01R 12/7082* (2013.01); *H01R 2201/26* (2013.01); *H05K 7/04* (2013.01)

(58) Field of Classification Search
CPC ........................... H01R 13/518; H01R 13/631; H01R 12/7082; H01R 2201/26; H02G 1/06; H02G 3/32
USPC ......................................................... 439/368
See application file for complete search history.

(56) References Cited

U.S. PATENT DOCUMENTS

| | | | | |
|---|---|---|---|---|
| 5,738,531 | A * | 4/1998 | Beaman | H01L 23/49827 439/71 |
| 5,752,845 | A * | 5/1998 | Fu | B60N 2/0715 439/247 |
| 5,857,863 | A * | 1/1999 | Onizuka | B60K 35/60 439/364 |
| 5,871,362 | A * | 2/1999 | Campbell | H01R 12/52 439/74 |
| 5,893,768 | A * | 4/1999 | Gawron | B60R 16/0207 439/571 |
| 6,007,375 | A * | 12/1999 | Mackowiak | H01R 13/743 439/571 |
| 6,024,590 | A * | 2/2000 | Mackowiak | H01R 13/518 439/247 |
| 6,296,492 | B1 * | 10/2001 | Fujimoto | H01R 13/6315 439/63 |
| 8,441,786 | B2 * | 5/2013 | Williams | H01R 12/724 361/679.33 |
| 9,225,087 | B2 * | 12/2015 | Lau | G11B 33/02 |
| 9,306,331 | B2 * | 4/2016 | Lange | H01R 13/6315 |
| 9,894,786 | B2 * | 2/2018 | Taubert | H01R 27/02 |
| 10,404,010 | B2 * | 9/2019 | Berrocal | B25J 19/0033 |
| 10,411,419 | B2 * | 9/2019 | You | H01R 13/6315 |
| 10,936,024 | B2 * | 3/2021 | Nguyen | G11B 33/126 |
| 11,031,730 | B2 * | 6/2021 | Mitter | H01R 13/08 |
| 11,523,530 | B2 * | 12/2022 | Peterson | H02G 1/06 |
| 2008/0239650 | A1 * | 10/2008 | Fujie | G06F 1/187 |
| 2022/0376436 | A1 * | 11/2022 | Campbell | H01R 13/506 |

* cited by examiner

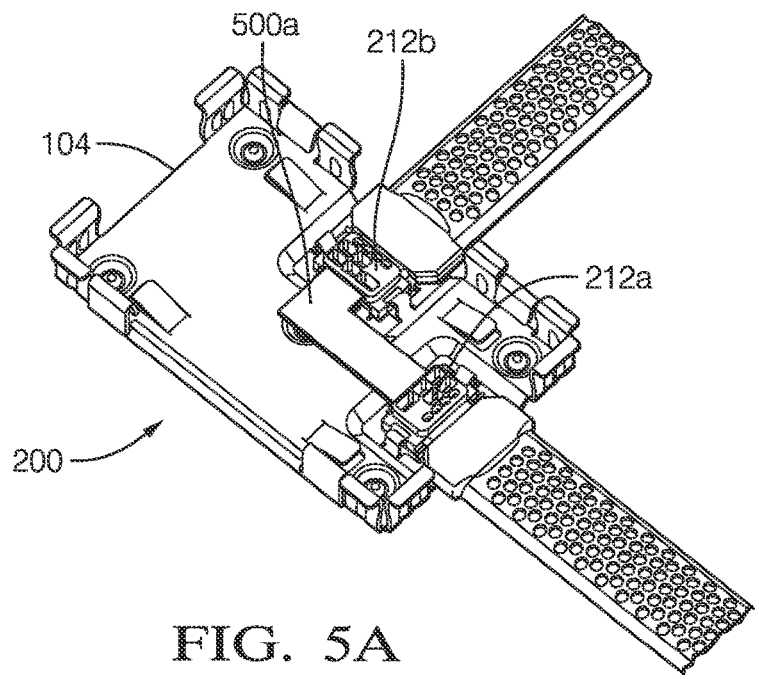
FIG. 5A
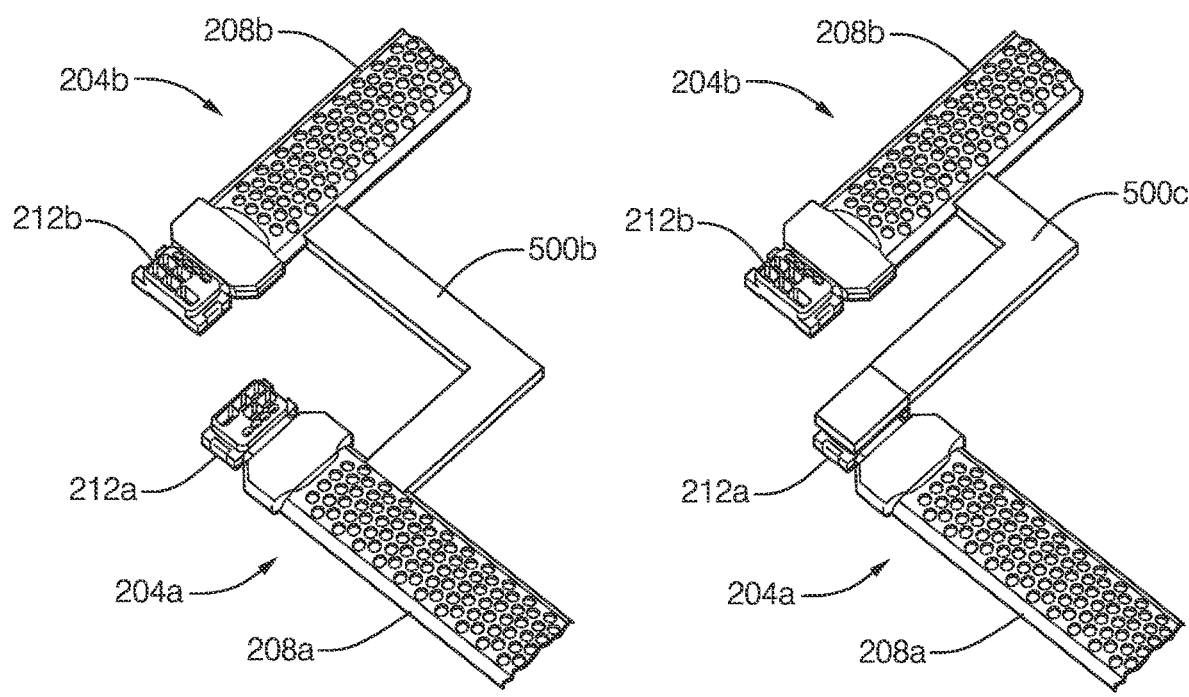
FIG. 5B
FIG. 5C

SELF-ALIGNING MECHANICAL MOUNT AND ELECTRICAL CONNECTION SYSTEM FOR ELECTRONIC MODULES WITH FEATURES FOR ROBOTIC ASSEMBLY

CROSS-REFERENCE TO RELATED APPLICATION(S)

The present application is a continuation of U.S. application Ser. No. 17/128,328 filed Dec. 21, 2020, which claims the benefit of U.S. Provisional Application No. 62/956,884, filed on Jan. 3, 2020. The disclosure of these application are incorporated herein by reference in their entirety.

FIELD

The present disclosure generally relates to automotive electrical systems and, more particularly, to a self-aligning mechanical mount and electrical connection system for electronic modules with features for robotic assembly.

BACKGROUND

An electrical system can comprise a plurality of electronic modules (e.g., controllers or control units) that are each configured to monitor and control a set of corresponding devices. For example, a plurality of electronic modules could be installed in distinct zones or areas relative to a base frame (e.g., a bottom or floor frame) of an electrified vehicle. Automated installation of these electronic modules by a robotic installer may be preferable to manual human installation due to increased speed and decreased costs. When installing an electronic module, however, there are typically a large number of wire cables that need to be connected thereto, which can be both complex and time consuming. For example, these wire cables may need to not only connect the electronic module to the respective devices that it monitors/controls, but they may also need to connect the electronic module to at least some of the other electronic modules (e.g., other electronic modules in the electrified vehicle). In addition, these electronic modules may need to be physically secured to minimize or eliminate potential damage due to physical vibration while also dissipating excessive heat energy. Accordingly, while conventional electronic modules and their methods of installation work well for their intended purpose, an opportunity exists for improvement in the relevant art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, a self-aligning mechanical mount and electrical connection system for an electronic module is presented. In one exemplary implementation, the system comprises a mechanical mount assembly configured to be integrated into or attached to a base frame and defining a mount connection position assurance (CPA) feature for self-aligning and securing of the electronic module therein, and an electrical connection assembly configured to be integrated into or attached to the mechanical mount assembly and comprising a modular electrical connector (i) being electrically connected to an electrical backbone wire cable and (ii) defining a connector CPA feature for self-aligning the modular electrical connector with a corresponding electrical connector integrated into or attached to the electronic module when the electronic module is secured in the mechanical mount assembly.

In some implementations, the base frame is a bottom or floor frame of an electrified vehicle and the electronic module is configured to be vertically installed by lowering the electronic module into the mechanical mount assembly until it is secured therein by the mount CPA feature. In some implementations, the electrical backbone wire cable comprises at least power wire cables and data wire cables, and wherein the electrical backbone wire cable is a substantially flat wire cable running along the bottom or floor frame of the electrified vehicle.

In some implementations, the system includes a plurality of electrical backbone wire cables, and wherein at least a portion of the plurality of electrical backbone wire cables are directly connected to each other via a bypass system such that power or data circuits unneeded by the electronic module bypass the electronic module. In some implementations, each modular electrical connector is positioned in an upward direction such that the corresponding electrical connector integrated into or attached to the electronic module is vertically installable therewith.

In some implementations, the mechanical mount assembly is formed of sheet metal and is integrated into a sheet metal portion of the bottom or floor frame of the electrified vehicle. In some implementations, the system further comprises a set of heat transfer devices configured to transfer heat energy away from the electronic module. In some implementations, the set of heat transfer devices are a set of one or more heat transfer pads that transfer heat energy from the electronic module to the sheet metal portion of the bottom or floor frame of the electrified vehicle.

In some implementations, the electronic module defines a set of one or more robotic installation features that are configured to be interacted with by an end effector of a robotic installer to lower the electronic module into the mechanical mount assembly until it is secured therein by the mount CPA feature. In some implementations, the electronic module is removable or configured to be freed from the mechanical mount assembly using a special physical tool controlled by a human technician or the robotic installer.

According to another aspect of the present disclosure, a method of mechanically mounting and aligning and electrically connecting an electronic module is presented. In one exemplary implementation, the method comprises providing a mechanical mount assembly configured to be integrated into or attached to a base frame and defining a mount CPA feature for self-aligning and securing of the electronic module therein, and providing an electrical connection assembly configured to be integrated into or attached to the mechanical mount assembly and comprising a modular electrical connector (i) being electrically connected to an electrical backbone wire cable and (ii) defining a connector CPA feature for self-aligning the modular electrical connector with a corresponding electrical connector integrated into or attached to the electronic module when the electronic module is secured in the mechanical mount assembly.

In some implementations, the base frame is a bottom or floor frame of an electrified vehicle, and the method further comprises vertically installing the electronic module by lowering the electronic module into the mechanical mount assembly until it is secured therein by the mount CPA feature. In some implementations, the electrical backbone wire cable comprises at least power wire cables and data wire cables, and wherein the electrical backbone wire cable is a substantially flat wire cable running along the bottom or floor frame of the electrified vehicle.

In some implementations, the electrical connection assembly includes a plurality of electrical backbone wire cables, and wherein at least a portion of the plurality of electrical backbone wire cables are directly connected to each other via a bypass system such that power or data circuits unneeded by the electronic module bypass the electronic module. In some implementations, each modular electrical connector is positioned in an upward direction such that the corresponding electrical connector integrated into or attached to the electronic module is vertically installable therewith.

In some implementations, the mechanical mount assembly is formed of sheet metal and is integrated into a sheet metal portion of the bottom or floor frame of the electrified vehicle. In some implementations, the method further comprises providing a set of heat transfer devices configured to transfer heat energy away from the electronic module, wherein the set of heat transfer devices are a set of one or more heat transfer pads that transfer heat energy from the electronic module to the sheet metal portion of the bottom or floor frame of the electrified vehicle.

In some implementations, the electronic module defines a set of one or more robotic installation features, and further comprising interacting, by an end effector of a robotic installer, with the set of one or more robotic installation features and lowering, by the robotic installer, the electronic module into the mechanical mount assembly until it is secured therein by the mount CPA feature. In some implementations, the method further comprises using, by a human technician or the robotic installer, a special physical tool to free the electronic module from the mechanical mount assembly such that it can be removed.

According to another aspect of the present disclosure, a self-aligning mechanical mount and electrical connection system for an electronic module is presented. In one exemplary implementation, the system comprises a mechanical mount assembly means for integration into or attachment to a base frame and defining a mount CPA feature means for self-aligning and securing of the electronic module therein, and an electrical connection assembly means for integration into or attachment to the mechanical mount assembly means, and comprising a modular electrical connector means for (i) being electrically connected to an electrical backbone wire cable means and (ii) defining a connector CPA feature means for self-aligning the modular electrical connector means with a corresponding electrical connector means integrated into or attached to the electronic module when the electronic module is secured in the mechanical mount assembly means.

According to yet another aspect of the present disclosure, a substantially flat electrical backbone wire cable is presented. In one exemplary implementation, the substantially flat electrical backbone wire cable comprises: a substantially flat power cable portion comprising a first set of dielectric insulation layers, a first shielding layer surrounded by at least some of the first set of dielectric insulation layers except for an exposed first shielding layer portion, a ground layer surrounded by at least some of the first set of dielectric insulation layers except for an exposed ground layer portion, and a power bus layer disposed between the first shielding and ground layers and surrounded by at least some of the first set of dielectric insulation layers except for an exposed power bus layer portion, and a substantially flat data cable portion substantially parallel and proximate to the substantially flat power cable portion and comprising a second set of dielectric insulation layers, second shielding layers surrounded by at least some of the second set of dielectric insulation layers except for exposed second shielding layer portions, and a set of data trace layers substantially parallel to each other and disposed between the second shielding layers and surrounded by at least some of the second set of dielectric insulation layers except for a set of exposed data trace layer portions.

In some implementations, at least one of: (i) the exposed first shielding, ground, and power bus layer portions are arranged in a sequential, vertically stepped, or staggered configuration, and (ii) the exposed second shielding and set of data trace layer portions are arranged in a sequential, vertically stepped, or staggered configuration. In some implementations, the exposed first shielding, ground, and power bus layer portions are arranged in a sequential, vertically stepped, or staggered configuration, and the exposed second shielding and set of exposed data trace layer portions are arranged in a sequential, vertically stepped, or staggered configuration.

In some implementations, the electrical backbone wire cable further comprises at least one U-shaped electrical connector electrically contacting each of the exposed first and second shielding, ground, power bus, and data trace layer portions. In some implementations, a wide bottom portion of each U-shaped electrical connector electrically contacts each of the exposed first and second shielding, ground, power bus, and data trace layer portions. In some implementations, the electrical backbone wire cable further comprises a modular electrical connector having the U-shaped electrical connectors integrated therein or having the U-shaped electrical connectors electrically connected thereto. In some implementations, the modular electrical connector is configured to be electrically connected to a corresponding electrical connector of an electronic module.

In some implementations, the electronic module is a controller or control unit of an electrified vehicle. In some implementations, the electronic module is configured to be physically secured to a bottom or floor frame of the electrified vehicle, and wherein the electrical backbone wire cable is configured to be installed along the bottom or floor frame of the electrified vehicle. In some implementations, an opposing end of the electrical backbone wire cable opposite the modular electrical connector is electrically connected to another modular electrical connector that is configured to be electrically connected to another corresponding electrical connector of another electronic module of the electrified vehicle.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 5A-5C illustrate example electronic module bypass systems for the self-aligning mechanical mount and electrical connection system of FIGS. 2A-2B according to some implementations of the present disclosure.

DETAILED DESCRIPTION

Figure 1A:
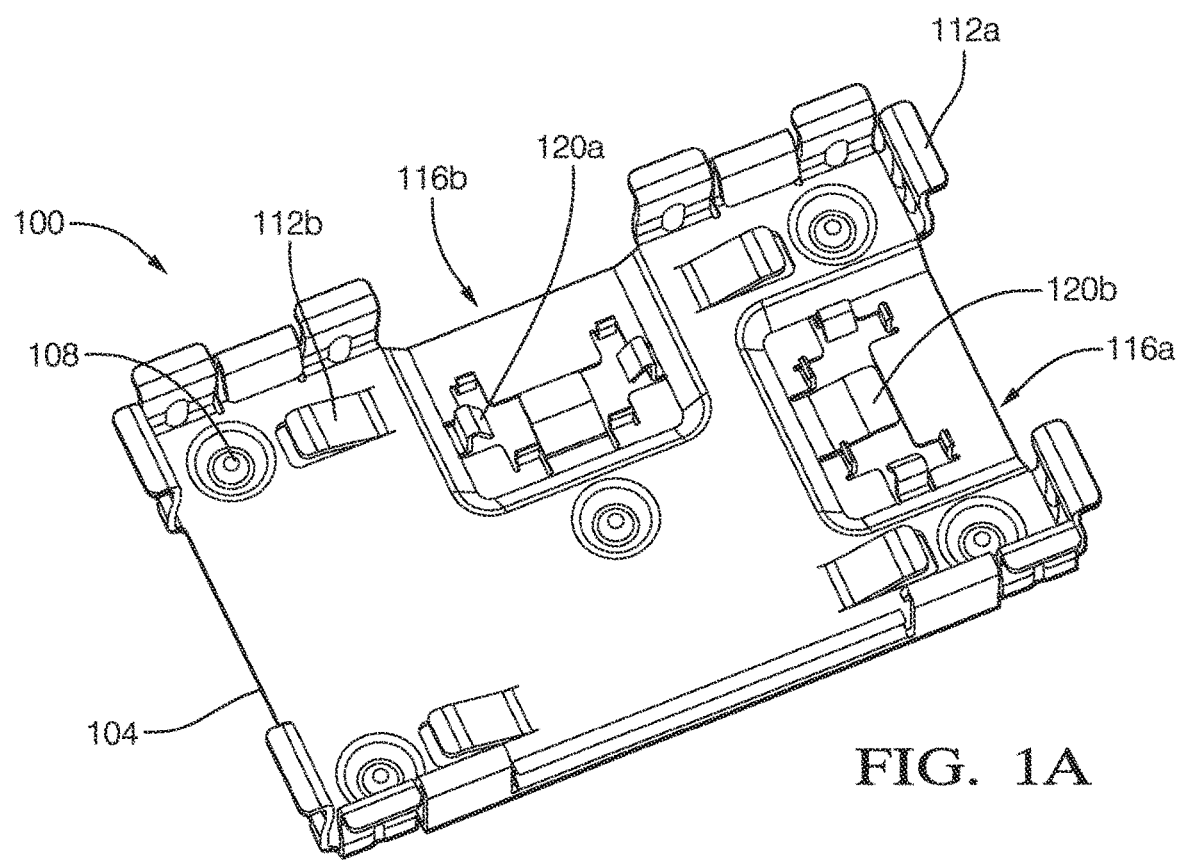
FIGS. 1A-1B illustrate views of an example mechanical mount assembly of a self-aligning mechanical mount and electrical connection system for an electronic module according to some implementations of the present disclosure.
Figure 1B:
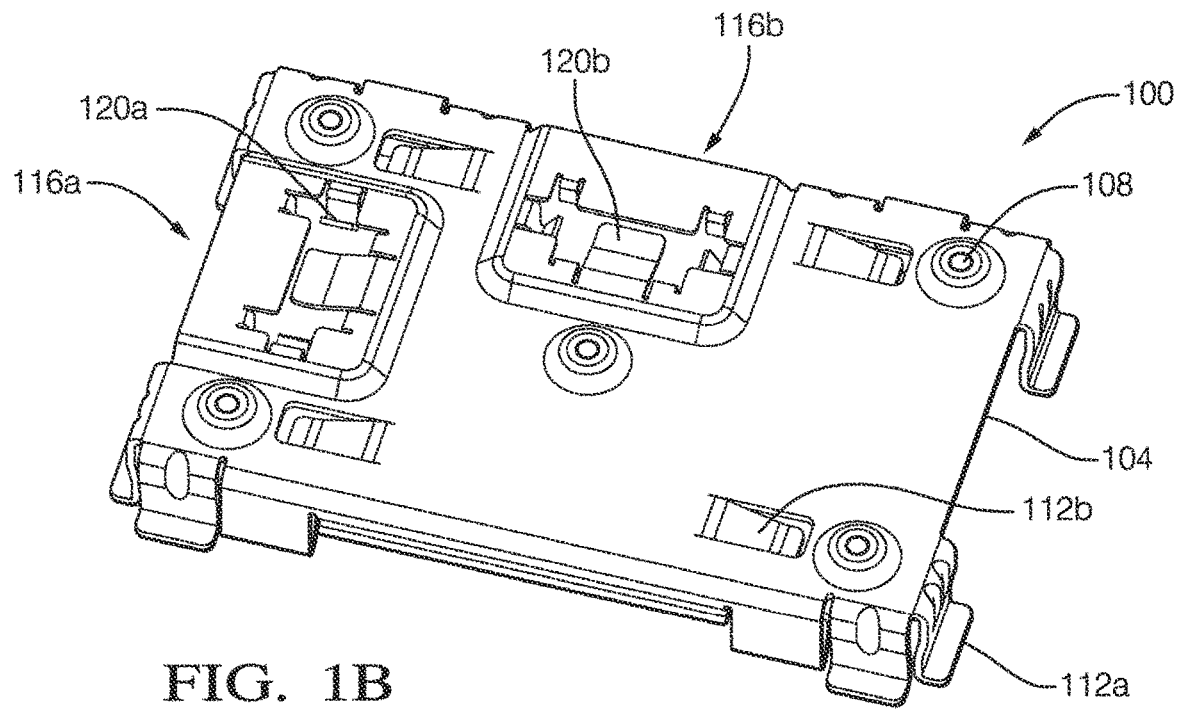

Referring now to FIGS. 1A-1B, an example configuration of a mechanical mount assembly 100 of a self-aligning mechanical mount and electrical connection system for an electronic module (not shown) according to the principles of the present disclosure is illustrated. The mechanical mount assembly 100 defines a base plate or base member 104 that is configured to be physically secured to a base frame. In one exemplary implementation, the base frame is a bottom or floor frame of an electrified vehicle (e.g., an autonomous vehicle), which is likely formed of a sheet metal (steel, aluminum, etc.). In one exemplary implementation, the mechanical mount assembly 100 is formed of the same or similar type of sheet metal as the bottom or floor frame of the electrified vehicle such that it could be integrally formed therewith. It will be appreciated, however, that the mechanical mount assembly 100 could also be physically attached to the bottom or floor frame, e.g., using attachment devices 108 defined in the base member 104, and that the mechanical mount assembly 100 could also be formed of different materials (e.g., injection molded plastic). The mechanical mount assembly 100 defines first and second sets of mount connection position assurance (CPA) features 112a, 112b. The first set of mount CPA features 112a are shown as spring clips that are configured to engage with side surfaces of the electronic module (not shown). The second set of mount CPA features 112b are also shown as spring clips that are configured to provide an upward resistive force on a bottom surface of the electronic module (not shown). While spring clips are specifically shown, it will be appreciated that any suitable CPA features for physically securing the electrical module (not shown) could be utilized.

Figure 2A:
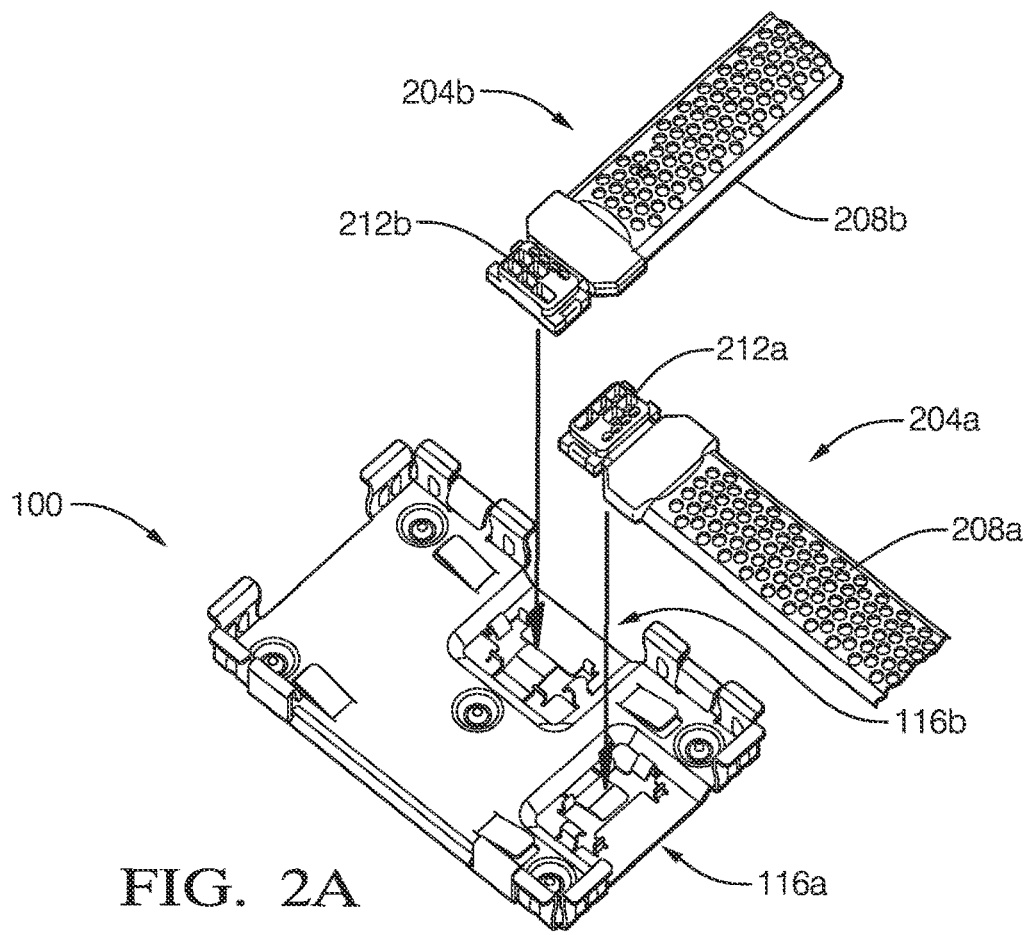
FIGS. 2A-2B illustrate views of an example assembly of the self-aligning mechanical mount and electrical connection system for the electronic module including the mechanical mount of FIGS. 1A-1B according to some implementations of the present disclosure.
Figure 2B:
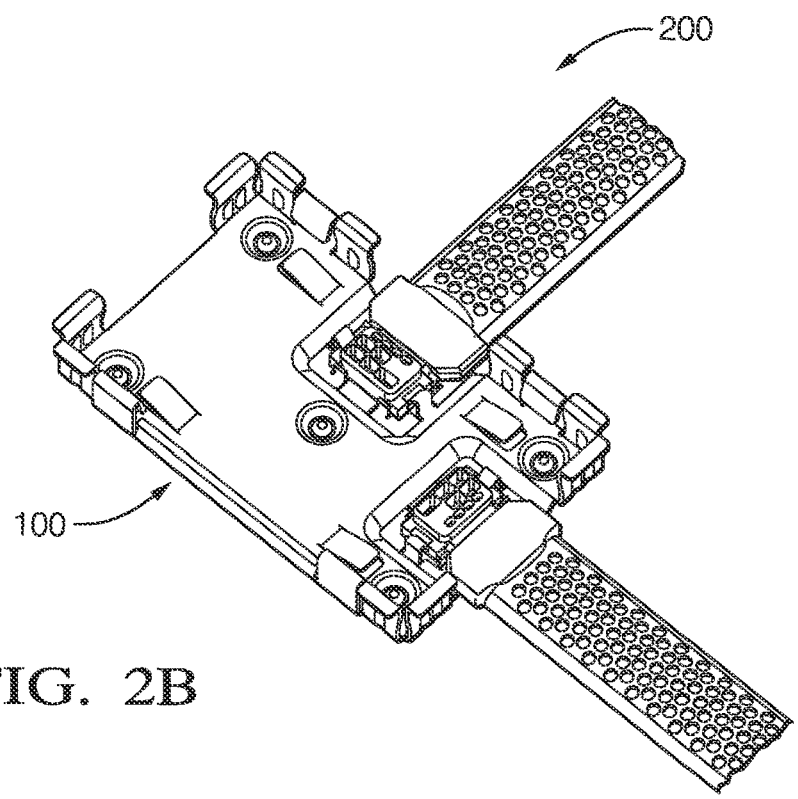

Referring now to FIGS. 2A-2B and with continued reference to the previous FIGS., the mechanical mount assembly 100 also defines a set of connector receptacles 116a, 116b and first and second sets of connector CPA features 120a, 120b for each connector receptacle 116a, 116b. While a rectangular-shaped mechanical mount assembly 100 and two connector receptacles 116a, 116b are shown, it will be appreciated that other electronic module shapes or configurations could be accommodated for, as well as other configurations and/or quantities of connector receptacles. The first set of connector CPA features 120a are shown as spring clips that are configured to engage with side surfaces of modular electrical connectors 212a, 212b, which are electrically connected to respective electrical backbone wire cables 208a, 208b to form respective electrical connection assemblies 204 (specifically referenced and labeled as 204a, 204b). The combination of the mechanical mount assembly 100 and the one or more electrical connection assemblies 204 collectively forms one example of the self-aligning mechanical mount and electrical connection system according to some implementations of the present disclosure, which is hereinafter referenced as 200. These electrical backbone wire cables 208a, 208b are substantially flat wire cables that are configured to transmit at least power and data (e.g., to/from other electronic modules of the electrified vehicle). The second set of connector CPA features 120b are also shown as spring clips that are configured to provide an upward resistive force on a bottom surface of the modular electrical connectors 212a, 212b. When secured in the connector receptacles 116a, 116b, the modular electrical connectors 212a, 212b will be electrically connectable to the electronic module (not shown). It will be appreciated that when secured in the connector receptacles 116a, 116b, the modular electrical connectors 212a, 212b may still have some degree of movability in order to self-align with corresponding electrical connectors of the electronic module (not shown), which will now be described in greater detail.

Figure 3A:
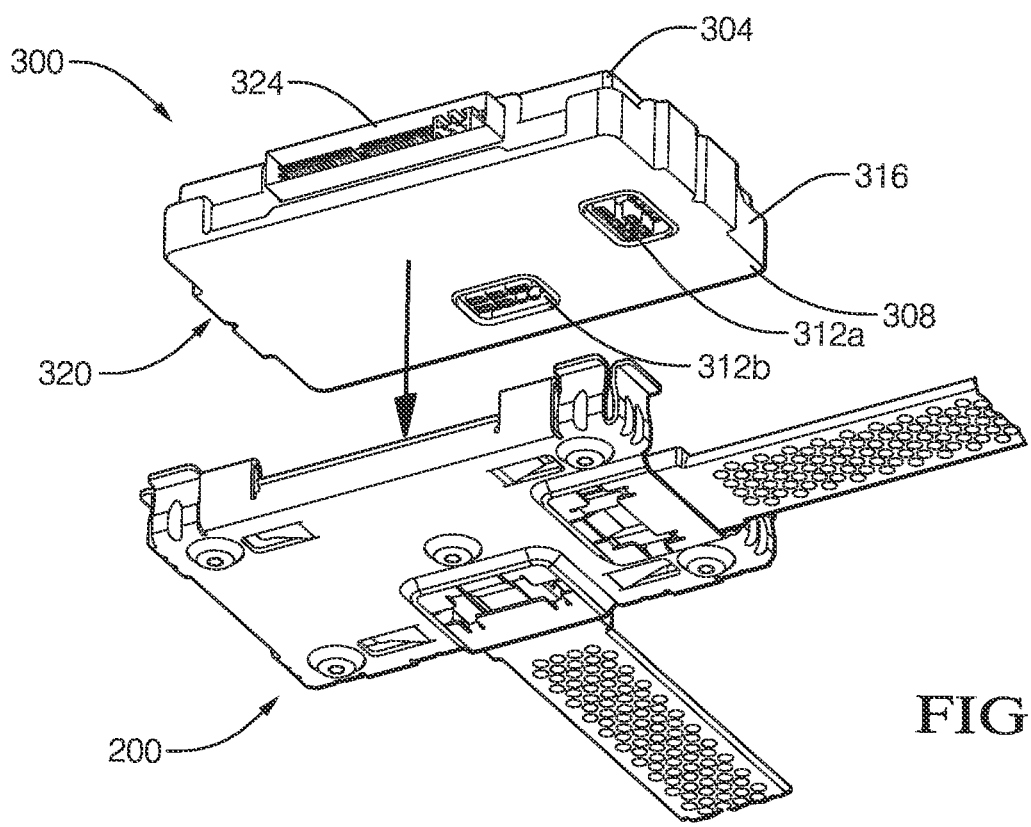
FIGS. 3A-3B illustrate a top-down installation of the electronic module with the self-aligning mechanical mount and electrical connection system of FIGS. 2A-2B according to some implementations of the present disclosure.
Figure 3B:
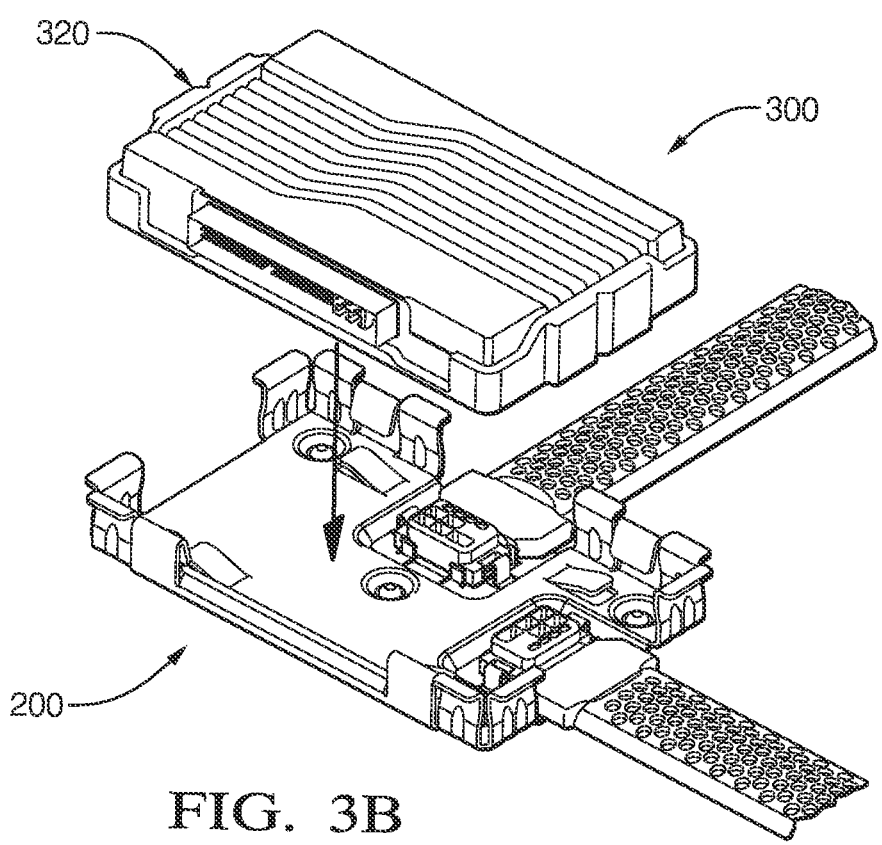

Referring now to FIGS. 3A-3B and with continued reference to the previous FIGS., an example top-down installation of an electronic module 300 with the self-aligning mechanical mount and electrical connection system 200 according to some implementations of the present disclosure is illustrated. The electronic module 300 comprises a housing 304 that houses an electronic system (not shown), which could include one or more processors, memory, and the like. In a bottom surface 308 of the housing 304, two electrical connectors 312a, 312b are defined, which correspond to modular electrical connectors 212a, 212b, respectively. In side surfaces 316 of the housing 304, robotic installation features 320 are defined for a robotic top-down installation of the electronic module 300. As shown, these robotic installation features are two square-shaped protrusions with a slot defined therebetween, which could be engaged and temporarily fixed to an end connector of a robotic installer (not shown). While side, slot-type robotic installation features are shown, it will be appreciated that any suitable robotic installation features could be integrated into the housing 304 or at least temporarily attached to the housing 304 such that an end effector of the robotic installer (not shown) can gain movable and secure control of the electronic module 300 to install it with the electrical connection system 200. In some implementations, one or more identifiers could be defined in the housing 304 to assist with robotic installation. The term "identifier" as used herein refers to any marking that could be identified by the robotic installer (not shown), including, but not limited to, barcodes, quick response (QR) codes, numerical, alphabetical, or alphanumerical strings, or symbols/shapes. For example only, the identifier(s) could be laser etched or engraved onto the housing 304. As shown, the electronic module 300 comprises another rectangular shaped connector 324 on one of its side surfaces 316. While not shown as electrically connecting to any modular electrical connector of the electrical connection system 200, it will be appreciated that the electrical connection system 200 could include another suitable modular electrical connector that could electrically connect to connector 324 during installation. For example only, this connector 324 could be used to connect the electronic module 300 to its respective electrical devices that it monitors/controls (e.g., RADAR, LIDAR, electric traction motors, and the like).

Figure 4A:
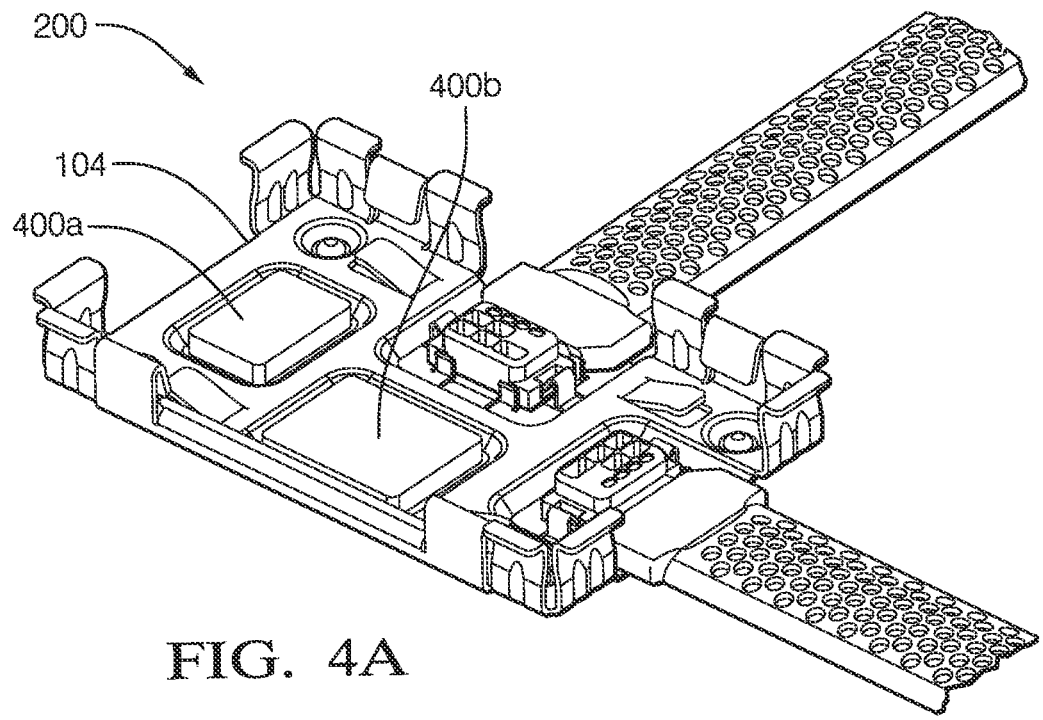
FIGS. 4A-4B illustrate example heat transfer devices for the self-aligning mechanical mount and electrical connection system of FIGS. 2A-2B according to some implementations of the present disclosure.
Figure 4B:
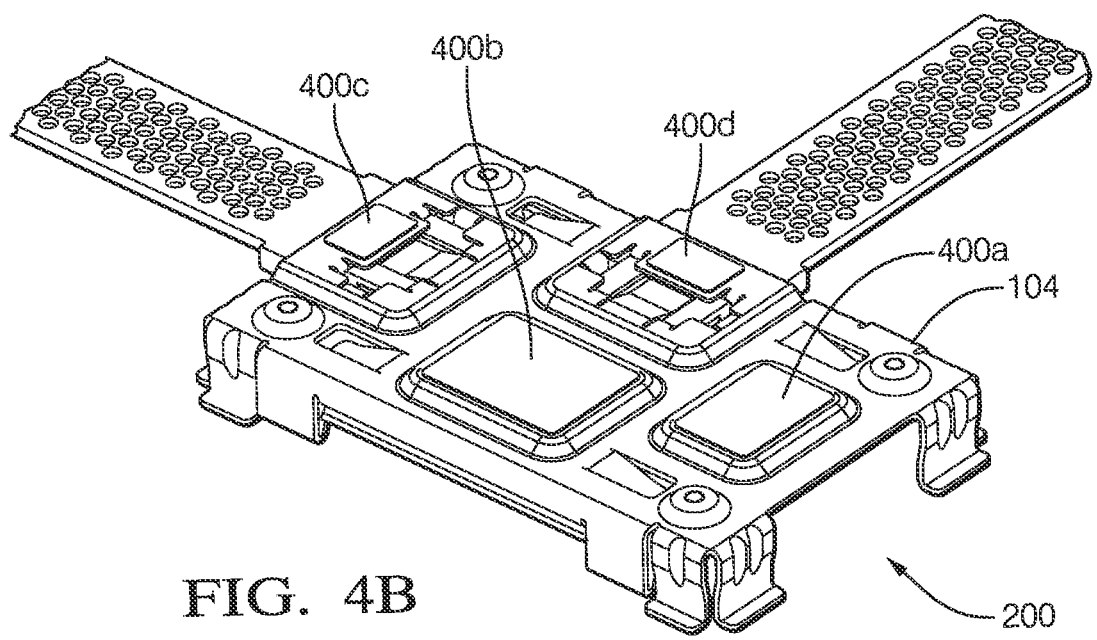

Referring now to FIGS. 4A-4B and with continued reference to the previous FIGS., example heat transfer devices 400 for the self-aligning mechanical mount and electrical connection system 200 according to some implementations of the present disclosure are illustrated. Each of these heat transfer devices 400 is configured to transfer or dissipate heat energy from the electronic module 300 and/or the one or more electrical connection assemblies 204 (e.g., modular electrical connectors 212a, 212b). These heat transfer devices 400 could be formed of any suitable material configured to transfer heat energy therethrough. By operating as a heat removal or heat sink, these heat transfer devices 400 are able to prevent potential damage to any of the components (e.g., electronic module 300) due to excessive heat energy. This could be particularly useful in an autonomous electrified vehicle application where a large amount of power and data is constantly flowing through the systems. In FIG. 4A, two of the heat transfer devices 400a, 400b are visible, which are associated with the electronic module 300 when it is installed in the electrical connection system 200. In FIG. 4B, the first two heat transfer devices 400a, 400b are still visible, whereas two additional heat transfer devices 400c, 400d associated with modular electrical connectors 212a, 212b, respectively, are also visible. While these heat transfer devices 400a, 400b, 400c, 400d (collectively, heat transfer devices 400) are shown as heat transfer pads 400a, 400b recessed in respective indentations or apertures defined in the base member 104 of the mechanical mount assembly 100, it will be appreciated that other types and/or configurations for the heat transfer devices 400 (active or passive) could be utilized. It will also be appreciated that a more complex heat transfer system could be utilized, or additional componentry that is not illustrated could be utilized. This could include, for example only, active cooling or heat transfer components such as air-based cooling components (e.g., fans or radiators) and/or liquid-based cooling components (water jackets, pumps, condensers/evaporators, refrigerant lines, etc.)

Referring now to FIGS. 5A-5C and with continued reference to the previous FIGS., example electronic module bypass systems 500 for the self-aligning mechanical mount and electrical connection system 200 according to some implementations of the present disclosure are illustrated. Each of these electronic module bypass systems 500 effectively bypasses the electronic module 300 with at least some portions of electrical backbone wire cables 208a, 208b. For example only, some electronic modules may not need all of the power and/or the data that is being carried along certain electrical backbone wire cables. In FIG. 5A, a first example electronic module bypass system 500a is illustrated. As shown, this electronic module bypass system 500a is a substantially flat wire cable that runs along the base member 104 and directly connects at least portions of the modular electrical connectors 212a, 212b, thereby bypassing the electronic module 300 when installed. The substantially flat shape of the electronic module bypass system 500a also will not affect the installation of the electronic module 300 into the electrical connection system 200. FIGS. 5B-5C illustrate two other example electronic module bypass systems 500b, 500c that are disposed or arranged outside of the mechanical mount assembly 100. In FIG. 5B, the electronic module bypass system 500b is a substantially flat wire cable that directly connects at least portions of electrical backbone wire cables 208a, 208b (thus bypassing both the electronic module 300 and the modular electrical connectors 212a, 212b). In FIG. 5C, the electronic module bypass system 500c is a substantially flat wire cable that directly connects at least portions of modular electrical connector 212a with electrical backbone wire cable 208b (thus bypassing both the electronic module 300 and modular electrical connector 212b). It will be appreciated that the reverse configuration of FIG. 5C could be utilized. It will also be appreciated that these electronic module bypass systems 500 could be round (e.g., coaxial) cables instead of substantially flat band-type cables, although the substantially flat band-type cables may be preferable for packaging reasons (e.g., fold flat during shipping and prior to installation).

Figure 6A:
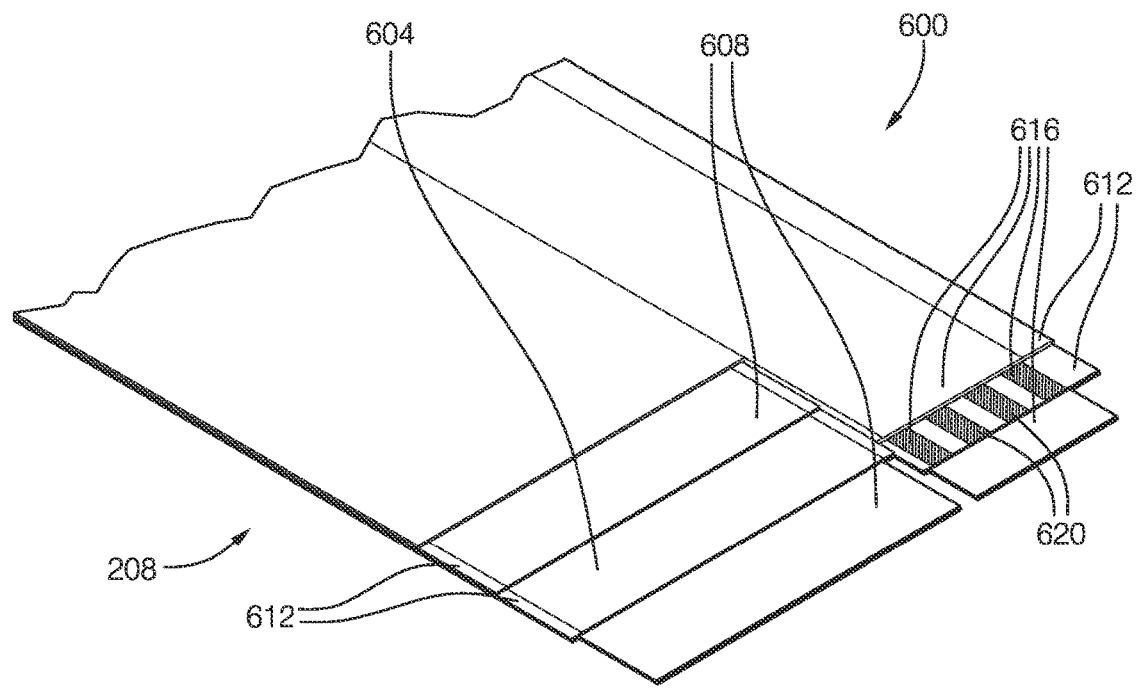
FIGS. 6A-6B illustrate example top-down construction or installation of electrical backbone wire cables for connection to the electronic module via the self-aligning mechanical mount and electrical connection system according to some implementations of the present disclosure.
Figure 6B:
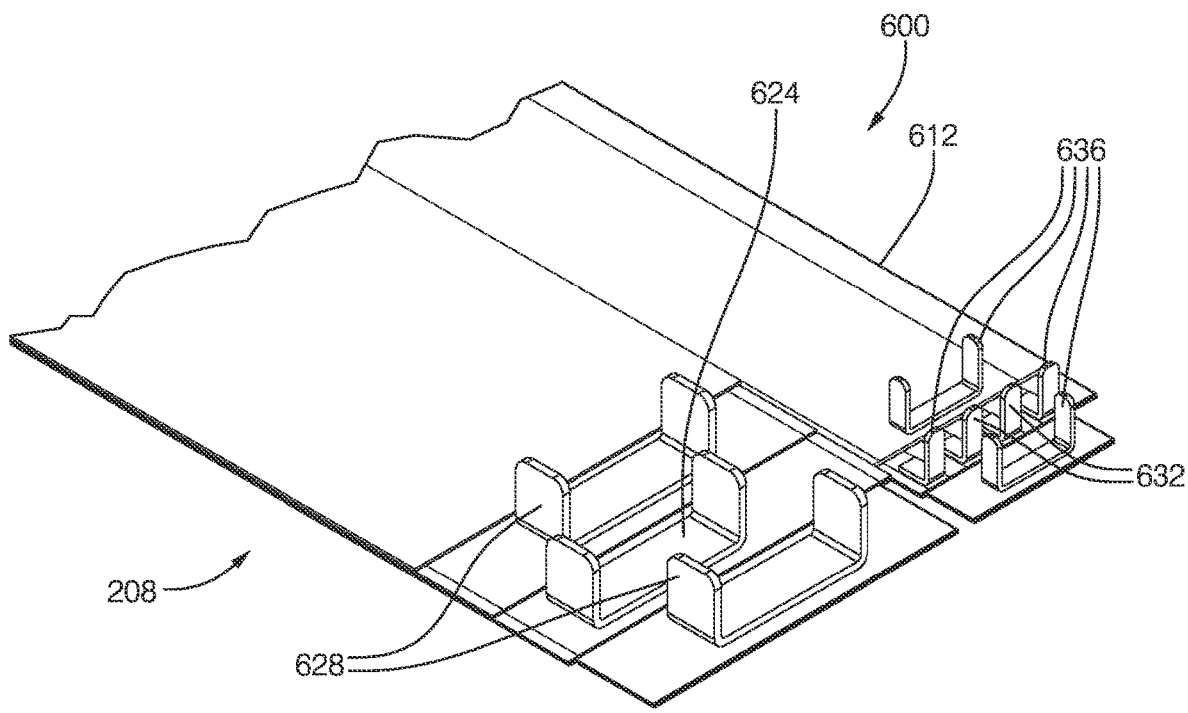

Referring now to FIGS. 6A-6B and with continued reference to the previous FIGS., an example top-down construction or installation of a portion 600 of one of the electrical backbone wire cables 208 that connects to the electronic module 300 via the self-aligning mechanical mount and electrical connection system 200 according to some implementations of the present disclosure is illustrated. In FIG. 6A, substantially flat shield and ground layers 608 have been laid with a substantially flat power bus layer laid therebetween. For example, these layers 604, 608 could be laid onto a surface in a top-down manner such that the layers are stacked together. Layers 604, 608 and dielectric insulation layer(s) 612 could also be referred to collectively as a power cable portion of the electrical backbone wire cable 208. Also in FIG. 6A, substantially flat data shield layers 620 have been laid with substantially flat data trace layers 616 laid therebetween. For example, these layers 616, 620 could be laid onto the same surface in a top-down manner such that the layers are stacked together and are positioned very close to the other stacked layers 604, 408. Layers 612, 616, and 620 could also be referred to collectively as a data cable portion of the electrical backbone wire cable 208. In addition, the ends of these layers 604, 608 and 612, 216 could be terminated at different lengths in order to provide top-down or vertical connection points for each layer 604, 608 and 612, 616, which will be described in greater detail below. This is also described herein as a sequential, vertical stepped or staggered configuration. In other words, the bottommost layer in each stack extends the furthest, with each layer there above extending a shorter distance but also a longer distance than the layer above it. Each layer 604, 608, 616, 620 could also be fully insulated by the respective dielectric insulation layer(s) 612. This top-down layering to form the portion 600 of the electrical backbone wire cable 208 provides for a substantially flat electrical backbone wire cable 208, which saves packaging space, while also providing optimal electrical connectivity. FIG. 6B illustrates the top-down electrical connectivity to the exposed portions of layers 604, 608, 616, and 620. As shown, U-shaped electrical connectors 624, 628, 632, 636 vertically contact layers 604, 608, 616, 620, respectively, with the wide bottom portion of each U-shaped electrical connector 624, 628, 632, 636 flatly contacting each respective layer 604, 608, 616, 620 to provide the above-described optimal electrical connectivity. Each of these U-shaped electrical connectors 624, 628, 632, 636, for example, could be integrated into or electrically connected to a respective one of the modular electrical connectors 212a or 212b. It will also be appreciated that the electrical backbone wire cable 208 could also include other wiring, such as one or more round coaxial cables running along top of the flat layers described above.

While a specific vertical or top-down installation of an electronic module at a bottom or floor frame of an electrified vehicle is specifically described and illustrated herein, it will be appreciated that there could be a variety of other applications for the self-aligning mechanical mount and electrical connection system according to the principles of the present disclosure. First, other mounting and installation configurations could be utilized (side/lateral, bottom-up, angled, etc.). One example alternative implementation would be at a vehicle firewall (i.e., between the vehicle cabin and the powertrain compartment) where wire cable pass through is typically performed manually by a human through a small opening. Using the system of the present disclosure, the system could be provided on one side of the opening or integrated therewith, and a robotic or human installer could then install a corresponding electronic module therewith in a single operation. Other non-limiting examples of vehicle applications include door electrical systems and corresponding electronic modules, vehicle dash/infotainment system electrical systems and corresponding electronic modules, and vehicle trunk electrical systems and corresponding electrical modules. Even further, it will be appreciated that a single system could accept multiple electronic modules, which could interface with each other or could be operated separately. For example, a single system could accept corresponding electronic sub-modules on two opposing sides, thereby electrically connecting two systems (e.g., the two electronic sub-modules could then function as one).

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

As used herein, the term electronic module may refer to, be part of, or include: an Application Specific Integrated Circuit (ASIC); an electronic circuit; a combinational logic circuit; a field programmable gate array (FPGA); a processor or a distributed network of processors (shared, dedicated, or grouped) and storage in networked clusters or datacenters that executes code or a process; other suitable components that provide the described functionality; or a combination of some or all of the above, such as in a system-on-chip. The term module may also include memory (shared, dedicated, or grouped) that stores code executed by the one or more processors.

The term code, as used above, may include software, firmware, byte-code and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein, and any references to specific languages are provided for disclosure of enablement and best mode of the present invention.

The present disclosure is well suited to a wide variety of computer network systems over numerous topologies. Within this field, the configuration and management of large networks comprise storage devices and computers that are communicatively coupled to dissimilar computers and storage devices over a network, such as the Internet.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A self-aligning mechanical mount and electrical connection system for an electronic module, the system comprising:
   a mechanical mount assembly including a set of heat transfer devices configured to transfer heat energy away from the electronic module, the mechanical mount assembly configured to be integrated into or attached to a base frame, and defining a mount connection position assurance (CPA) feature for self-aligning and securing of the electronic module therein; and
   an electrical connection assembly:
      configured to be integrated into or attached to the mechanical mount assembly, and
      comprising at least one modular electrical connector each (i) being electrically connected to an electrical backbone wire cable and (ii) defining a connector CPA feature for self-aligning the modular electrical connector with a corresponding electrical connector integrated into or attached to the electronic module.

2. The system of claim 1, wherein the electrical backbone wire cable comprises at least power wire cables and data wire cables, wherein the system includes a plurality of electrical backbone wire cables, and wherein at least a portion of the plurality of electrical backbone wire cables are directly connected to each other via a bypass system such that power or data circuits unneeded by the electronic module bypass the electronic module.

3. The system of claim 1, wherein each modular electrical connector is positioned in an upward direction and each corresponding electrical connector is integrated into or attached to a bottom surface of the electronic module such that the electronic module is vertically installable therewith.

4. The system of claim 3, wherein the electronic module defines a set of one or more robotic installation features that are configured to be interacted with by an end effector of a robotic installer to lower the electronic module into the mechanical mount assembly until each modular electrical connector is secured therein to its respective corresponding electrical connector by the respective connector CPA feature.

5. The system of claim 4, wherein each modular electrical connector is secured therein to its respective corresponding electrical connector by the respective connector CPA feature while the electronic module is being lowered into the mechanical mount assembly.

6. The system of claim 5, wherein each modular electrical connector is secured therein to its respective corresponding electrical connector by the respective connector CPA feature before the electronic module is secured therein the mechanical mount assembly by the mount CPA feature.

7. The system of claim 5, wherein each modular electrical connector is secured therein to its respective corresponding electrical connector by the respective connector CPA feature while the electronic module is also secured therein the mechanical mount assembly by the mount CPA feature.

8. The system of claim 1, wherein the mechanical mount assembly is formed of sheet metal and is integrated into a sheet metal portion of a bottom or floor frame of an electrified vehicle.

9. The system of claim 8, wherein the set of heat transfer devices are a set of one or more heat transfer pads that transfer heat energy from the electronic module to the sheet metal portion of the bottom or floor frame of the electrified vehicle.

10. A method of mechanically mounting and aligning and electrically connecting an electronic module, the method comprising:
    providing a mechanical mount assembly including a set of heat transfer devices configured to transfer heat energy away from the electronic module, the mechanical mount assembly:
       configured to be integrated into or attached to a base frame, and
       defining a mount connection position assurance (CPA) feature for self-aligning and securing of the electronic module therein; and
    providing an electrical connection assembly:
       configured to be integrated into or attached to the mechanical mount assembly, and
       comprising at least one modular electrical connector each (i) being electrically connected to an electrical backbone wire cable and (ii) defining a connector CPA feature for self-aligning the modular electrical connector with a corresponding electrical connector integrated into or attached to the electronic module.

11. The method of claim 10, wherein the electrical backbone wire cable comprises at least power wire cables and data wire cables, and further comprising providing a plurality of electrical backbone wire cables, wherein at least a portion of the plurality of electrical backbone wire cables are directly connected to each other via a bypass system such that power or data circuits unneeded by the electronic module bypass the electronic module.

12. The method of claim 10, wherein each modular electrical connector is positioned in an upward direction and each corresponding electrical connector is integrated into or attached to a bottom surface of the electronic module such that the electronic module is vertically installable therewith.

13. The method of claim 12, wherein the electronic module defines a set of one or more robotic installation features, and further comprising interacting, by an end effector of a robotic installer, with the set of robotic installation features to lower the electronic module into the mechanical mount assembly until each modular electrical connector is secured therein to its respective corresponding electrical connector by the respective connector CPA feature.

14. The method of claim 13, wherein each modular electrical connector is secured therein to its respective corresponding electrical connector by the respective connector CPA feature while the electronic module is being lowered into the mechanical mount assembly.

15. The method of claim 14, wherein each modular electrical connector is secured therein to its respective corresponding electrical connector by the respective connector CPA feature before the electronic module is secured therein the mechanical mount assembly by the mount CPA feature.

16. The method of claim 14, wherein each modular electrical connector is secured therein to its respective corresponding electrical connector by the respective connector CPA feature while the electronic module is also secured therein the mechanical mount assembly by the mount CPA feature.

17. The method of claim 10, wherein the mechanical mount assembly is formed of sheet metal and is integrated into a sheet metal portion of a bottom or floor frame of an electrified vehicle.

18. The method of claim 17 wherein the set of heat transfer devices are a set of one or more heat transfer pads that transfer heat energy from the electronic module to the sheet metal portion of the bottom or floor frame of the electrified vehicle.

19. A self-aligning mechanical mount and electrical connection system for an electronic module, the system comprising:

first means including a fifth means for transferring heat energy away from the electronic module, the first means for integration into or attachment to a base frame, and for defining a mount connection position assurance (CPA) feature for self-aligning and securing of the electronic module therein; and second means:
for integration into or attachment to the first means, and
comprising at least one third means each for (i) electrically connecting to a fourth means and (ii) defining a connector CPA feature for self-aligning the third means with a corresponding electrical connector integrated into or attached to the electronic module.

20. The system of claim 19, wherein the fourth means comprises at least power wire cable and data wire cable, wherein the system includes a plurality of fourth means, and wherein at least a portion of the plurality of fourth means are for directly connecting to each other via a bypass system such that power or data circuits unneeded by the electronic module bypass the electronic module.

21. A self-aligning mechanical mount and electrical connection system for an electronic module, the system comprising:

a mechanical mount assembly configured to be integrated into or attached to a base frame, and defining a mount connection position assurance (CPA) feature for self-aligning and securing of the electronic module therein; and an electrical connection assembly:
configured to be integrated into or attached to the mechanical mount assembly, and
comprising at least one modular electrical connector each (i) being electrically connected to an electrical backbone wire cable and (ii) defining a connector CPA feature for self-aligning the modular electrical connector with a corresponding electrical connector integrated into or attached to the electronic module,
wherein the electrical backbone wire cable comprises at least power wire cables and data wire cables, wherein the system includes a plurality of electrical backbone wire cables, and wherein at least a portion of the plurality of electrical backbone wire cables are directly connected to each other via a bypass system such that power or data circuits unneeded by the electronic module bypass the electronic module.

* * * * *